United States Patent
Zhang et al.

(10) Patent No.: US 8,063,451 B2
(45) Date of Patent: Nov. 22, 2011

(54) SELF-ALIGNED NANO FIELD-EFFECT TRANSISTOR AND ITS FABRICATION

(75) Inventors: Zhiyong Zhang, Beijing (CN); Lianmao Peng, Beijing (CN); Sheng Wang, Beijing (CN); Xuelei Liang, Beijing (CN); Qing Chen, Beijing (CN)

(73) Assignee: Peking University, Beijing (CN)

( * ) Notice: Subject to any disclaimer, the term of this patent is extended or adjusted under 35 U.S.C. 154(b) by 119 days.

(21) Appl. No.: 12/571,453

(22) Filed: Oct. 1, 2009

(65) Prior Publication Data
US 2010/0090293 A1    Apr. 15, 2010

(30) Foreign Application Priority Data
Oct. 9, 2008    (CN) .......................... 2008 1 0223905

(51) Int. Cl.
*H01L 29/72*    (2006.01)
(52) U.S. Cl. ........ 257/401; 257/330; 257/365; 257/411; 977/938
(58) Field of Classification Search .................. 257/330, 257/365, 401, 411; 977/938
See application file for complete search history.

(56) References Cited

U.S. PATENT DOCUMENTS
2008/0063566 A1*   3/2008   Matsumoto et al. ......... 422/68.1

OTHER PUBLICATIONS

Javey et al, "Carbon Nanotube Field Effect Transistors with Integrated Ohmic Contacts and High-k Gate Dielectrics", Feb. 20, 2004.*
Javey et al., Ballistic Carbon Nanotube Field-Effect Transistors, Nature 2003, pp. 654-657 vol. 424.
Zhang et al., Doping-Free Fabrication of Carbon Nanotube Based Ballistic CMOS Devices and Circuits, Nano Letters 2007, pp. 3603-3607, vol. 7, No. 12.
Javey et al., Carbon Nanotube Field-Effect Transistors With Integrated Ohmic Contacts and High-K Gate Dielectrics, Nano Letters 2004, pp. 447-450, vol. 4, No. 3.

* cited by examiner

*Primary Examiner* — Edward Wojciechowicz
(74) *Attorney, Agent, or Firm* — SV Patent Service

(57) ABSTRACT

Our invention discloses a self-aligned-gate structure for nano FET and its fabrication method. One dimension semiconductor material is used as conductive channel, whose two terminals are source and drain electrodes. Gate dielectric grown by ALD covers the area between source electrode and drain electrode, opposite sidewalls of source electrode and drain electrode, and part of upper source electrode and drain electrode. Gate electrode is deposited on gate dielectric by evaporation or sputtering. Total thickness of gate dielectric and electrode must less than source electrode or drain electrode. Gate electrode between source electrode and drain electrode is electrically separated from source and drain electrode by gate dielectric. The fabrication process of this self-aligned structure is simple, stable, and has high degree of freedom. Nearly the whole conductive channel between source electrode and drain electrode is covered by gate electrode, so the control efficiency of the gate over the conductive channel, described as transconductance, can be greatly enhanced. Additionally, there is no restriction on material of gate dielectric or electrode, so the devices' threshold voltage can be adjusted to satisfy the requirements of large scale integrated circuit.

20 Claims, 2 Drawing Sheets

SELF-ALIGNED NANO FIELD-EFFECT TRANSISTOR AND ITS FABRICATION

FIELD OF INVENTION

This invention is related to field-effect transistor (FET), in particularly, to one dimension nanomaterials based self-aligned FET.

BACKGROUND

There is a bright application future for the semiconductor carbon nanotube (s-CNT) based nano-electronics, which is predicted to be the alternative to silicon based microelectronic integrated circuit technology. According to ten-year research, it is found that s-CNT based nano-electronic devices, especially FET, are superior to silicon based MOSFET on many key device metrics, such as power consumption, speed and integrated density, etc. Additionally, ohmic contact is achieved for hole between palladium and s-CNT, and high performance p-type CNTFET is fabricated [A. Javey, J. Guo, Q. Wang, M. Lundstrom, H. Dai, Nature, 424, 654(2003)]. Besides, scandium is used as electrode to form ohmic contact with s-CNT for electron and fabricate high-performing n-type CNTFET [Zhang, Z. Y.; Liang, X. L.; Wang, S.; Yao, K.; Hu, Y. F.; Zhu, Y. Z.; Chen, Q.; Zhou, W. W.; Li, Y.; Yao, Y. G.; Zhang, J.; Peng, L. M. Nano Lett., 7, 3603 (2007)]. The fabrication process for CNTFET based integrated circuit is very simple related to silicon based CMOS technology mainly due to doping-free and no requirement of high temperature process. Then the cost for CNTFET integrated circuit will be greatly reduced, while the cost is considered to be one of the most important obstacles to the further development of silicon based CMOS technology.

Channel length is one of the vital parameters for FET transistor. In silicon based CMOS technology, speed of devices and integration density of circuit is continuously improved due to the reduction of channel length. The situation is same for CNTFET. To improve devices' speed and density, we have to reduce the channel length, which is defined to be the distance between source-electrode and drain-electrode. As the size of the device becomes smaller and smaller there is a need for a more precise and reliable way to fabricate MOS FETs. The gate-electrode must be posited just between source-electrode and drain-electrode, and cover the channel at the utmost. In this way, the gate can control the channel most efficiently. However, it is necessary to prevent the overlap between gate and source or drain to eliminate large parasitic capacitance and degradation the speed of the transistors. This requirement for alignment between gate and source/drain cannot be achieved only through lithography alignment. So, it is essential to adopt a self-aligned gate structure. In the state-of-the-art silicon based CMOS technology, the use of self-aligned gates is one of the many innovations that has enabled computing power to increase steadily over the last 40 years. A self-aligned structure is therefore necessary for massive fabricating of high performance CNT FETs and for the construction of CNT based CMOS integrated circuits.

One kind of self-aligned structure for CNTFET was developed by professor Dai H J's group from Stanford University [Javey, A.; Guo, J.; Farmer, D. B.; Wang, Q.; Wang, D. W.; Gordon, R. G.; Lundstrom, M.; Dai, H. J. Nano Lett., 4, 447 (2004)]. Hafnium oxide is used as the gate dielectric layer grown by ALD, and aluminum is adopted as the gate electrode. To separate the gate electrode from source and drain electrodes, the aluminum gate electrode is baked in air so that a thin $Al_2O_3$ layer was formed at the sidewall. However, there are obvious shortcomings in this method. Firstly, source and drain electrodes should be so thin (typically less than 10 nanometers) that the contact resistance between source/drain electrodes and the channel is consequently very large. More importantly, only these metals that can be oxidized to compact oxide layer can be chosen as the gate electrode. That is, only some low work function metals are suitable. Actually, this limits us to adjust the threshold voltage, which is also an important parameter of FET especially in integrated circuit. Because CNTFETs are doping-free, their threshold voltages cannot be adjusted by doping the channel. Instead, metals with different work function are utilized as the gate electrode to adjust the threshold voltage, while Dai's self-aligned structure is not compatible with this method. So, to promote the development of nanoelectronic devices and integrated circuit, it is very valuable to develop a novel self-aligned structure, which should be more stable, more flexible, and simpler.

DETAILS OF THE INVENTION

This invention contains a self-aligned gate structure for FET and its fabrication technology. In this device, one dimensional nanomaterial is used as the electric conduction channel which is almost completely covered by the gate electrode, which is electrically separated from source/drain electrodes.

The above-mentioned target will be achieved through the technical scheme as following:

A FET with self-aligned gate structure, in which one dimensional semiconducting nanomaterial is used as the electric conduction channel, whose two ends contacted with source and drain electrodes, and the gate dielectric layer is grown by ALD. Channel between source and drain electrodes, inner sidewalls and part of the source and drain electrodes are covered by the oxidized layer; the gate electrode is deposited above the gate dielectric by E-beam evaporation, thermal evaporation or magnetron sputtering. The total thickness of the gate dielectric/electrode stack must be smaller than the thickness of the source or drain electrodes. The gate electrode above the conduction channel is electrically separated from the source and drain electrodes by the oxide layer on the sidewalls of these two electrodes.

Carbon nanotube is widely used as the one dimensional nanomaterial, and high work function metals, such as Pd, are used as the contact electrodes to fabricate p-type FET, while low work function metals, such as Sc, are used to fabricate n-type FET.

Normal thickness of the source and drain electrodes is 50 to 80 nanometers, and gate dielectric thickness is always 5 to 15 nanometers, while gate electrode thickness is also 5 to 15 nanometers.

There is no special requirement for the material of gate dielectric and electrode. Any insulator, such as hafnium oxide, aluminum oxide, zirconium oxide or silicon oxide, can be used as the gate dielectric. Different kinds of metals or other conductor materials can be used to form the gate electrode via evaporation or sputtering as required. For example, titanium films or any conductive films are suitable.

In this self-aligned gate structure, source and drain electrodes should be thick enough and their sidewalls must be sharp. These can be obtained by lift-off or dry-etching. Gate dielectric is grown by ALD, and the gate electrode is conductive film grown by E-beam evaporation or magnetron sputtering. Picture 1 is the typical diagram of nano FET with this self-aligned gate structure. In this picture, 1 is one dimensional semiconducting material, and 2/3 is source/drain electrode. For the special geometry of the one dimensional material, the gate stack layer contains two kinds of film grown by ALD and evaporation (sputtering) respectively. We make use of the different mechanisms between these two film growth methods to fabricate the self-aligned gate FET. Gate dielectric layer (4) is grown by ALD, so all the exposed surfaces, including sidewalls of source and drains electrodes, will be covered by an excellent oxide layer with uniform thickness. The gate electrode is grown by evaporation (or sputtering), and only the horizontal surfaces can be covered by metal or other conductive films. Thus, the gate electrode and source/drain electrodes is automatically separated so that part 5 between source/drain electrodes are separated from part 6 and 7 above source/drain electrodes. Therefore, parasitic capacitance between the gate electrode and source/drain electrodes are significantly reduced, and the switch speed of FET is greatly enhanced.

The present invention provides the fabricating method of the self-aligned gate structure nano FET as following:
1. Source and drain electrodes are fabricated on the one dimensional semiconducting material.
2. Gate electrode is patterned via lithography. A part of source/drain electrodes should be covered by the gate electrode pattern.
3. Gate dielectric, which is an oxide layer, is grown by ALD.
4. Gate electrode, a conductive film, is grown by E-beam evaporation or magnetron sputtering. The total thickness of the gate dielectric/electrode stack must be smaller than the thickness of the source or drain electrodes.
5. A lift-off process is carried out, and gate electrode is fabricated.

In step 1, source and drain electrodes are patterned via lithography on the one dimension semiconducting nano-material. Then, metal films are deposited by E-beam evaporation. At last, unwanted metals on the wafer are removed by lift-off or etching. Preferred thickness of source and drain electrodes is 50 to 80 nanometers and their opposite sidewalls must be sharp, preferably perpendicular to the one dimensional semiconducting nano-material. Regularly, carbon nanotube is adopted as this one dimensional semiconducting nano-material.

In step 3, favorite thickness for oxide layer is 5 to 15 nanometers. Any insulator, such as hafnium oxide, aluminum oxide, zirconium oxide or silicon oxide, grown by ALD is acceptable.

In step 4, proper thickness for conductive film is 5 to 15 nanometers. We can use any metals or other conductive materials that can be grown by evaporation or sputtering.

The core of our invention relates to a self-aligned-gate structure, which is used to fabricate FET based on one dimensional semiconducting nano-material. The fabrication process of this self-aligned structure is simple, stable, and free. The key issues of present invention contain:
1. The total thickness of the gate dielectric/electrode stack must be smaller than the thickness of the source or drain electrodes. The opposite sidewalls of source and drain electrodes must be sharp enough so that gate electrode can be disjunctive at the sidewalls.
2. The covering area of the stack should be larger than the part between source electrode/drain electrode. To tolerate lithography registration deviation, the gate stack must overlap source/drain electrode adequately.
3. Gate dielectric is oxide layer grown by ALD, while gate electrode is conductive film grown by E-beam evaporation, thermal evaporation, or magnetron sputtering.

In the said structure, assuming the distance between source electrode and drain electrode (distance between part 2 and part 3 in FIG. 1) is L and thickness of gate dielectric is d, the effective length of the gate is $L_g=L-2d$. The thickness of the film, named d, which is grown by ALD, can be very small, typically 10 nanometers, so $L_g$ is close to L. That is, almost of whole conductive channel between source electrode and drain electrode is covered by gate electrode, so the control efficiency of the gate over the conductive channel, described as transconductance, can be greatly enhanced. Besides, there are only special limits on the grown methods of gate dielectric and gate electrode in our structure, but no limit on their materials. Therefore, any metals or conductive films can be utilized as gate electrode, thus the devices' threshold voltage can be adjusted to satisfy the requirements for circuit design.

PREFERRED EMBODIMENTS

The present invention will be described in detail through preferred embodiments with appendix figures, but does not limit to these embodiments.

Embodiment 1

Figure 1:
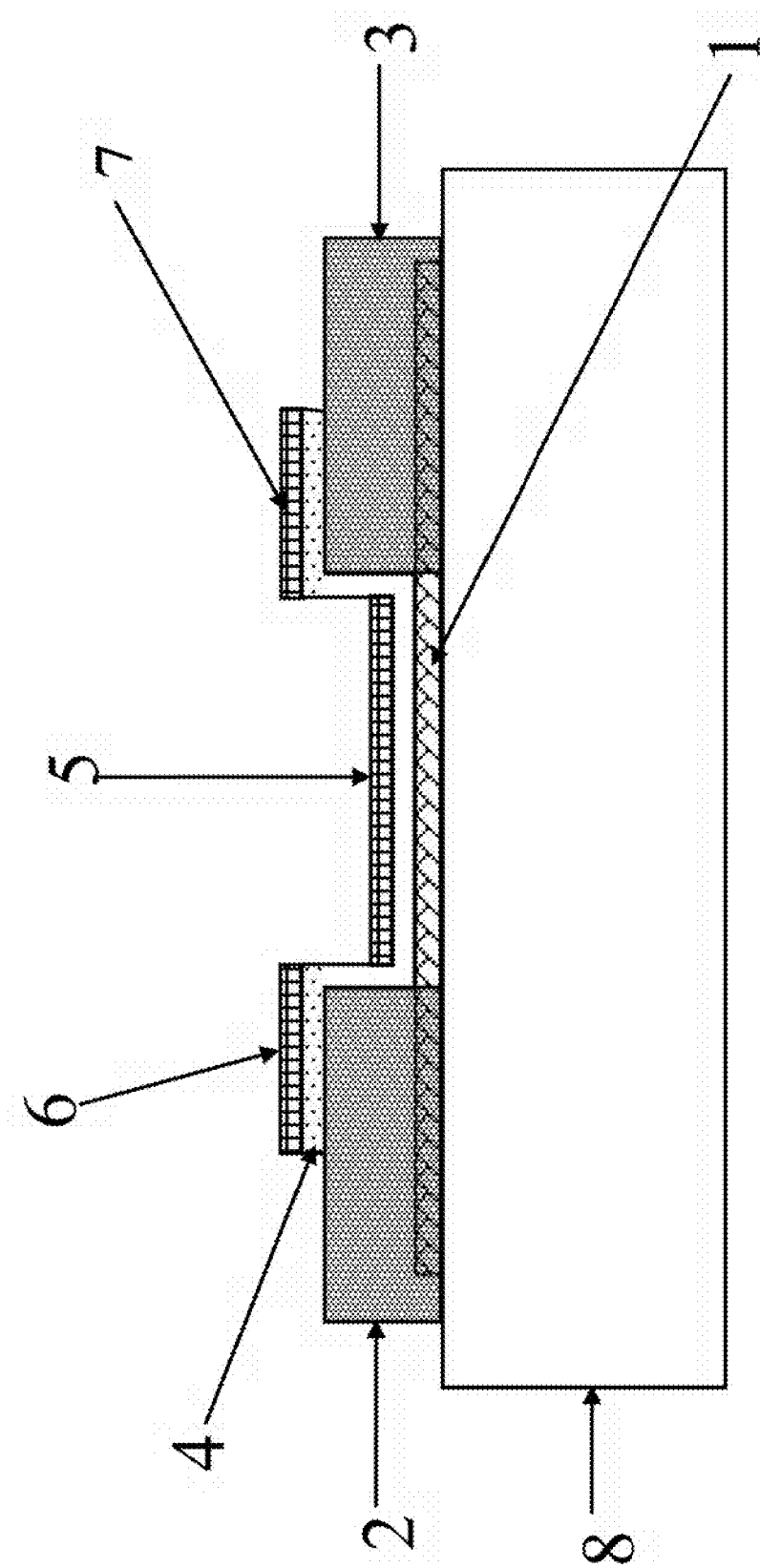
FIG. 1 is a schematic diagram of a CNT-based FET with self-aligned-gate structure.

FIG. 1 illustrates a CNT-based FET with self-aligned-gate structure. Sc is utilized in as a source electrode 2 and a drain electrode 3. Ti is used in gate electrode layers 5, 6, 7. A gate dielectric layer 4 is made of hafnium oxide. CNT (1) is formed on an insulation substrate (8). The source electrode (2) and the drain electrode (3) are respectively formed on the CNT 1. The gate dielectric layer 4 is formed by hafnium oxide grown by ALD. The gate electrode layers 5, 6, 7 are metal films deposited by evaporation or sputtering. The gate electrode layer 5 is between the source electrode 2 and the drain electrode 3 and separated from the gate electrode layers 6, 7. Here are the details about the fabrication process:
1. Source and drain electrodes 2, 3 are patterned via lithography on semiconductor CNT 1. Then, a Sc layer of 80 nm in thickness is deposited. Lift-off is carried out in acetone to remove needless metals to form the spatially separate source electrode 2 and the drain electrodes 3.
2. Gate electrode layer 5, 6, 7 are patterned via lithography. Part of source and drain electrodes 2, 3 must be covered by gate electrode.
3. A $HfO_2$ layer of 10 nm in thickness is grown by ALD to form the gate dielectric layer 4.
4. A Ti layer of 8 nm in thickness is deposited by E-beam evaporation, thermal evaporation or magnetron sputtering to be form the gate electrode layers 5, 6, 7.
5. Lift-off is carried out in acetone, and gate electrode is fabricated.

Figure 2A:
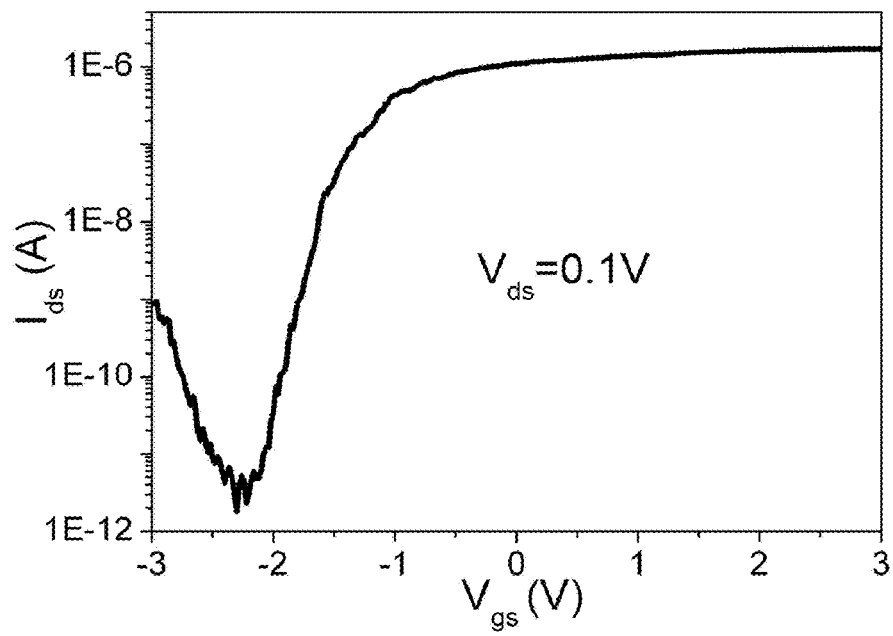
FIG. 2a shows an exemplified transfer characteristic ($I_{ds}$–$V_{gs}$) for the CNT-based FET with self-aligned-gate structure in FIG. 1.
Figure 2B:
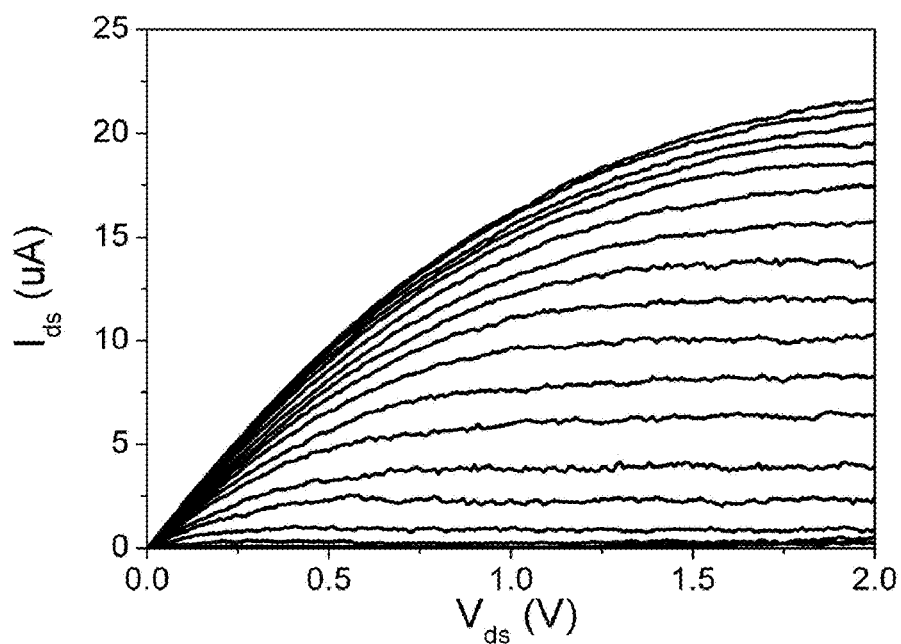
FIG. 2b shows an exemplified output characteristic ($I_{ds}$–$V_{ds}$) for the CNT-based FET with self-aligned-gate structure in FIG. 1. In this figure, $V_{gs}$ is varied from 2V to −1V in step of −0.2V from top to bottom.

FIG. 2a and FIG. 2b are transfer characteristic and output characteristic of our n-type CNT-based FET respectively.

Principle and example of our invention are all expounded via CNT-based device, but not only CNT, but also other FETs based on semiconductor nanowire, nanotube, and nanoribbon can be fabricated with our methods. Basic principle is also suitable for other one dimension semiconductor nano-material based FET. Any FETs based on our self-aligned-gate structure with any parts' materials, thickness, or fabrication methods modified belong to our invention's category.

The invention claimed is:

1. A self-aligned nano field effect transistor, comprising:
   a substrate;
   a one-dimensional conductive nano material comprising a first end, a second end, and a middle portion;
   a source electrode layer formed on the substrate and the first end of the one-dimensional conductive nano material, wherein the source electrode layer is elevated above the substrate and the middle portion of the one-dimensional conductive nano material, wherein the source electrode layer comprises a first upper surface and a first side wall;
   a drain electrode layer formed on the substrate and the second end of the one-dimensional conductive nano material, wherein the drain electrode layer is elevated above the substrate and the middle portion of the one-dimensional conductive nano material, wherein the drain electrode layer comprises a second upper surface and a second side wall;
   a gate dielectric layer formed on the first upper surface and the first side wall of the source electrode layer, the second upper surface and the second side wall of the drain electrode layer, and the middle portion of the one-dimensional conductive nano material; and
   a gate electrode layer on the gate dielectric layer, wherein the gate electrode layer comprises a first portion over the middle portion of the one-dimensional conductive nano material, wherein the first portion of the gate electrode layer is below the first upper surface of the source electrode layer and the second upper surface of the drain electrode layer.

2. The self-aligned nano field effect transistor of claim 1, wherein the gate electrode layer comprises a second portion over the source electrode layer, wherein the second portion of the gate electrode layer is separate from the first portion of the gate electrode layer.

3. The self-aligned nano field effect transistor of claim 2, wherein the gate electrode layer comprises a third portion over the drain electrode layer, wherein the third portion of the gate electrode layer is separate from the first portion of the gate electrode layer.

4. The self-aligned nano field effect transistor of claim 1, wherein the gate electrode layer and the gate dielectric layer cover a portion of the first upper surface of the source electrode layer.

5. The self-aligned nano field effect transistor of claim 1, wherein the gate electrode layer and the gate dielectric layer cover a portion of the second upper surface of the drain electrode layer.

6. The self-aligned nano field effect transistor of claim 1, wherein the one-dimensional conductive nano material comprises carbon nano tubes.

7. The self-aligned nano field effect transistor of claim 1, wherein the gate dielectric layer comprises an oxide material.

8. The self-aligned nano field effect transistor of claim 7, wherein the gate dielectric layer comprises hafnium oxide, aluminum oxide, zirconium oxide or silicon oxide.

9. The self-aligned nano field effect transistor of claim 1, wherein the gate dielectric layer is formed by atomic layer deposition (ALD).

10. The self-aligned nano field effect transistor of claim 1, wherein the gate electrode layer is formed by a metallic material.

11. The self-aligned nano field effect transistor of claim 1, wherein the gate electrode layer is formed by E-beam evaporation, thermal evaporation, or magnetron sputtering.

12. The self-aligned nano field effect transistor of claim 1, wherein the gate electrode layer is electrically insulated from the source electrode layer and the drain electrode layer by the gate dielectric layer.

13. The self-aligned nano field effect transistor of claim 1, wherein the source electrode layer and the drain electrode layer have thicknesses from about 50 nanometers to about 80 nanometers.

14. The self-aligned nano field effect transistor of claim 1, wherein the total thickness of the gate dielectric layer and the gate electrode layer is from about 5 nanometers to about 15 nanometers.

15. A self-aligned nano field effect transistor, comprising:
    a substrate;
    a one-dimensional conductive nano material comprising a first end, a second end, and a middle portion;
    a source electrode layer formed on the substrate and the first end of the one-dimensional conductive nano material, wherein the source electrode layer is elevated above the substrate and the middle portion of the one-dimensional conductive nano material, wherein the source electrode layer comprises a first upper surface and a first side wall;
    a drain electrode layer formed on the substrate and the second end of the one-dimensional conductive nano material, wherein the drain electrode layer is elevated above the substrate and the middle portion of the one-dimensional conductive nano material, wherein the drain electrode layer comprises a second upper surface and a second side wall;
    a gate dielectric layer formed on the first upper surface and the first side wall of the source electrode layer, the second upper surface and the second side wall of the drain electrode layer, and the middle portion of the one-dimensional conductive nano material; and
    a gate electrode layer on the gate dielectric layer, wherein the gate electrode layer comprises a first portion over the middle portion of the one-dimensional conductive nano material, a second portion over the source electrode layer, and a third portion over the drain electrode layer, the first portion of the gate electrode layer is separate from the second portion of the gate electrode layer and the third portion of the gate electrode layer.

16. The self-aligned nano field effect transistor of claim 15, wherein the first portion of the gate electrode layer is below the first upper surface of the source electrode layer and the second upper surface of the drain electrode layer.

17. The self-aligned nano field effect transistor of claim 15, wherein the total thickness of the gate dielectric layer and the gate electrode layer is smaller than the thickness of the source electrode layer or the drain electrode layer.

18. The self-aligned nano field effect transistor of claim 15, wherein the total thickness of the gate dielectric layer and the gate electrode layer is from about 5 nanometers to about 15 nanometers.

19. The self-aligned nano field effect transistor of claim 15, wherein the source electrode layer and the drain electrode layer have thicknesses from about 50 nanometers to about 80 nanometers.

20. The self-aligned nano field effect transistor of claim 15, wherein the one-dimensional conductive nano material comprises carbon nano tubes.

* * * * *